(12) United States Patent
Yuan

(10) Patent No.: US 8,395,168 B2
(45) Date of Patent: Mar. 12, 2013

(54) SEMICONDUCTOR WAFERS AND SEMICONDUCTOR DEVICES WITH POLISHING STOPS AND METHOD OF MAKING THE SAME

(75) Inventor: Shu Yuan, Hong Kong (CN)

(73) Assignee: Hong Kong Applied Science and Technology Research Institute Co. Ltd., Hong Kong (CN)

( * ) Notice: Subject to any disclaimer, the term of this patent is extended or adjusted under 35 U.S.C. 154(b) by 784 days.

(21) Appl. No.: 12/134,682

(22) Filed: Jun. 6, 2008

(65) Prior Publication Data

US 2009/0302336 A1 Dec. 10, 2009

(51) Int. Cl.
*H01L 33/00* (2010.01)

(52) U.S. Cl. ............... 257/98; 257/79; 257/94; 257/95; 438/29; 438/424

(58) Field of Classification Search ............... 257/98, 257/79, 94, 95; 438/22, 25, 26, 27, 29, 424
See application file for complete search history.

(56) References Cited

U.S. PATENT DOCUMENTS

| | | | |
|---|---|---|---|
| 3,753,775 A | | 8/1973 | Robinson et al. |
| 5,064,683 A | | 11/1991 | Poon et al. |
| 5,131,963 A | * | 7/1992 | Ravi ............... 148/33.3 |
| 5,262,346 A | | 11/1993 | Bindal et al. |
| 5,300,188 A | * | 4/1994 | Tessmer et al. ............ 216/81 |
| 5,332,467 A | * | 7/1994 | Sune et al. ............ 438/633 |
| 5,729,029 A | * | 3/1998 | Rudaz ............... 257/13 |
| 5,774,487 A | * | 6/1998 | Morgan ............ 372/45.01 |
| 5,872,415 A | * | 2/1999 | Dreifus et al. ............ 310/311 |
| 5,907,768 A | * | 5/1999 | Malta et al. ............ 438/105 |
| 6,346,747 B1 | * | 2/2002 | Grill et al. ............ 257/752 |
| 6,627,520 B2 | * | 9/2003 | Kozaki et al. ............ 438/479 |
| 6,786,809 B1 | | 9/2004 | Held |
| 6,821,804 B2 | * | 11/2004 | Thibeault et al. ............ 438/29 |
| 7,083,996 B2 | * | 8/2006 | Nagahama et al. ............ 438/46 |
| 7,732,301 B1 | * | 6/2010 | Pinnington et al. ............ 438/455 |
| 2004/0033638 A1 | * | 2/2004 | Bader et al. ............ 438/46 |
| 2004/0113166 A1 | | 6/2004 | Tadatomo et al. |

(Continued)

FOREIGN PATENT DOCUMENTS

WO  WO-2005/088743 A1  9/2005
WO  WO 2005088743 A1 * 9/2005

OTHER PUBLICATIONS

Epitaxial Lateral Overgrowth of GaN, Beaumont et al, phys. stat. sol. (b) 227, No. 1, 1-43 (2001).
Office Action of Aug. 16, 2012 from related U.S. Appl. No. 12/648,781.

*Primary Examiner* — Thao Le
*Assistant Examiner* — Eric Jones
(74) *Attorney, Agent, or Firm* — Venable LLP; Jeffri A. Kaminski; Todd R. Farnsworth

(57) ABSTRACT

Semiconductor wafers, semiconductor devices, and methods of making semiconductor wafers and devices are provided. Embodiments of the present invention are especially suitable for use with substrate substitution applications, such in the case of fabricating vertical LED. One embodiment of the present invention includes a method of making a semiconductor device, the method comprising providing a substrate; forming a plurality of polishing stops on the substrate; growing one or more buffer layers on the substrate; growing one or more epitaxial layers on the one or more buffer layers; and applying one or more metal layers to the one or more epitaxial layers. Additionally, the steps of affixing a second substrate to the one or more metal layers and removing the base substrate using a mechanical thinning process may be performed.

23 Claims, 7 Drawing Sheets

U.S. PATENT DOCUMENTS

| | | |
|---|---|---|
| 2004/0224536 A1 | 11/2004 | Sriram et al. |
| 2004/0245543 A1* | 12/2004 | Yoo ............................. 257/103 |
| 2005/0169597 A1* | 8/2005 | Colgan et al. ................. 385/137 |
| 2006/0003581 A1 | 1/2006 | Johnston et al. |
| 2007/0072372 A1 | 3/2007 | Cho |
| 2007/0096130 A1* | 5/2007 | Schiaffino et al. .............. 257/98 |
| 2008/0217631 A1 | 9/2008 | Hsu et al. |

* cited by examiner

SEMICONDUCTOR WAFERS AND SEMICONDUCTOR DEVICES WITH POLISHING STOPS AND METHOD OF MAKING THE SAME

FIELD OF THE INVENTION

The present invention relates to semiconductor wafers and semiconductor devices, and more particularly, to a method of making semiconductor wafers and semiconductor devices.

BACKGROUND OF THE INVENTION

The fabrication of semiconductor wafers, which are then used for the fabrication of semiconductor devices, is a well developed area of technology. Many different semiconductor wafer fabrication methods exist, and there are also many known methods of making semiconductor devices from pre-fabricated wafers. Semiconductor devices are now ubiquitous in modern technological devices and apparatus.

While many wafers and semiconductor devices are built on a silicon substrate, or similar material, certain devices are preferably built on a sapphire substrate, such as vertical gallium-nitride (GaN)-based light emitting diode (LED). In some known processes, the sapphire substrate is removed using a laser lift off (LLO) process, exposing the various n-type layers for subsequent etching and removal such that an n-type electrode may contact the lightly doped n-type GaN layer.

However, the known methods of manufacturing vertical GaN-based LED, and other semiconductor devices, have limitations in that the LLO process can be inadequate, damaging, and inefficient for manufacturing reliable, efficient LED. Also, due to the similar etching selectively of the various GaN layers, it can be difficult to differentiate the interface between the different layers. Accordingly, there is a need for a method of making semiconductor devices that solves the shortcomings of known methods.

SUMMARY OF THE INVENTION

According to one embodiment of the present invention, a semiconductor wafer is disclosed. The semiconductor a substrate; a plurality of polishing stops on the substrate; one or more buffer layers grown on the substrate; and one or more epitaxial layers on the one or more buffer layers.

According to another embodiment of the present invention, a semiconductor device is disclosed. The semiconductor device includes a substrate; a plurality of polishing stops on the substrate; one or more buffer layers grown on the substrate; one or more epitaxial layers on the one or more buffer layers; and one or more metal layers on the one or more epitaxial layers According to another embodiment of the present invention, a method of making a semiconductor wafer is disclosed. The method includes providing a substrate; forming a plurality of polishing stops on the substrate; growing one or more buffer layers on the substrate; and growing one or more epitaxial layers on the one or more buffer layers.

According to another embodiment of the present invention, a method of making a semiconductor wafer is disclosed. The method includes providing a substrate; growing a first one or more buffer layers on the substrate; forming a one or more polishing stops on first one or more buffer layers; and growing one or more epitaxial layers on the first one or more buffer layers.

According to one embodiment of the present invention, a method of making a semiconductor device is disclosed. The method includes providing a substrate; forming a plurality of polishing stops on the substrate; growing one or more buffer layers on the substrate; growing one or more epitaxial layers on the one or more buffer layers; applying one or more metal layers to the one or more epitaxial layers; affixing a second substrate to the one or more metal layers; and removing the substrate using a mechanical thinning process.

Still other embodiments of the present invention will become readily apparent to those skilled in the art from the following detailed description, wherein embodiments of the invention are described by way of illustration. As will be realized, the invention is capable of other and different embodiments and its several details are capable of modifications in various respects, all without departing from the spirit and the scope of the present invention.

DETAILED DESCRIPTION

In the following description, reference is made to the accompanying drawings where, by way of illustration, specific embodiments of the invention are shown. It is to be understood that other embodiments may be used as structural and other changes may be made without departing from the scope of the present invention. Also, the various embodiments and aspects from each of the various embodiments may be used in any suitable combinations. Accordingly, the drawings and detailed description are to be regarded as illustrative in nature and not as restrictive.

Generally, the present invention is directed to semiconductor wafers, semiconductor devices, and methods of making semiconductor wafers and devices. Embodiments of the present invention are suitable for use with substrate substitution, wherein removal of the substrate is facilitated by the composition of the semiconductor wafer or semiconductor device and a new, second substrate is applied. FIGS. 1 to 6 are directed generally to methods of making a semiconductor wafer. FIGS. 7 to 13 are directly generally to methods of making semiconductor devices using the semiconductor wafer described with reference to FIGS. 1 to 6. The embodiments shown and described with reference to the figures may be used in the fabrication of LED, and specifically vertical GaN-based LED. However, it will be appreciated that the described methods are not limited to any specific engineering applications and any suitable semiconductor devices may be made according to embodiments of the present invention such as, for example, LED, laser diodes, transistors and other power devices, growth and fabrication of free-standing semiconductor materials, and other suitable applications.

In the fabrication of GaN-based LED, specifically, the removal of the base sapphire substrate and replacement of it with a new substrate has advantages, such as improved thermal management, enhanced light extraction through surface texturing on the newly exposed surface, and more uniformity in current distribution. According to embodiments of the present invention, removal of the sapphire substrate is generally performed by a mechanical thinning method, such as grinding, lapping, polishing, and/or chemical mechanical polishing, used in the fabrication of semiconductor devices, such as the manufacture of LED, using polishing stops. According to embodiments of the present invention, polishing stops are provided during the wafer growth or wafer fabrication stage, thereby providing higher yield and improved device performance.

Throughout the descriptions, use of the prefix "u-" stands for undoped or lightly doped, "p-" stands for p-type or positive, and "n-" stands for n-type or negative.

Figure 1:
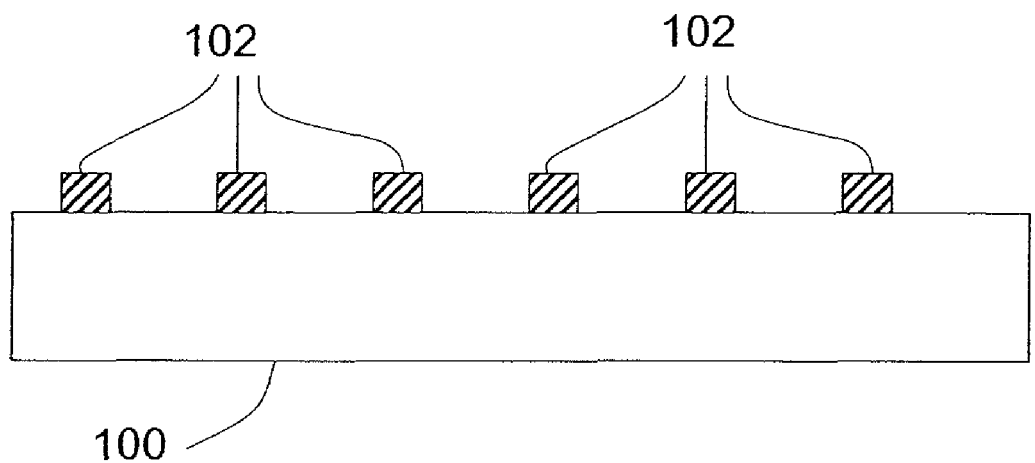
FIG. 1 is a cross-sectional view of a semiconductor wafer showing the formation of polishing stops, according to an embodiment of the present invention.

Referring now to the figures, FIG. 1 is a cross-sectional view of a semiconductor wafer showing the formation of polishing stops, according to an embodiment of the present invention. A substrate 100 is provided. Polishing stops 102 are formed on the substrate. The polishing stops may be formed using any suitable method. According to one example method, referred to as a subtraction method, a layer of hard material is applied to the entire surface of the substrate 100. A pattern is then formed in the layer of hard material, removing the undesired parts of the layer of hard material and leaving only the desired polishing stops 102. According to another example method, referred to as the addition method, a mask pattern is created across the surface of the substrate 100, leaving holes or trenches, or other desired shapes of openings. Then, a hard material is deposited across the substrate 100 and into the openings. The mask pattern is then removed leaving the polishing stops 102 along the surface of the substrate 100. The application and removal of masks may be done using known photoresist processes. According to one embodiment, the polishing stops 102 are formed on the substrate 100. However, according to another embodiment, the polishing stops 102 are formed on other layers of the semiconductor wafer.

One example substrate is formed of sapphire, which is well suited for vertical LED fabrication processes. Embodiments of the present invention may be especially suited for used with type III-IV, non-silicon materials. In type III-IV material, the epitaxial growth process may be important in the construction and operation of devices later formed on the semiconductor wafer. However, applications of the present invention should not necessarily be limited to these materials, and any other suitable substrate materials may be used in accordance with embodiments of the present invention.

The hard material is any suitable hard material. In one example embodiment, the hard material is the hardest of all materials being used in the wafer or device. The hard material may be diamond film or diamond like carbon (DLC) film. Other suitable hard material for use as polishing stops 102 may be, for example, diamond, diamond like carbon (DLC), titanium nitride (TiNx), titanium tungsten (TiWx) alloy, or other suitable materials. The size of the polishing stops can be any width and height required for the particular application of the wafer being fabricated. Also, the term "hard" as used to describe the polishing stops 102 is not meant to be limited to the examples given or to any specific levels of hardness or softness but may be any type of material suitable for accomplishing the described method.

Figure 2:
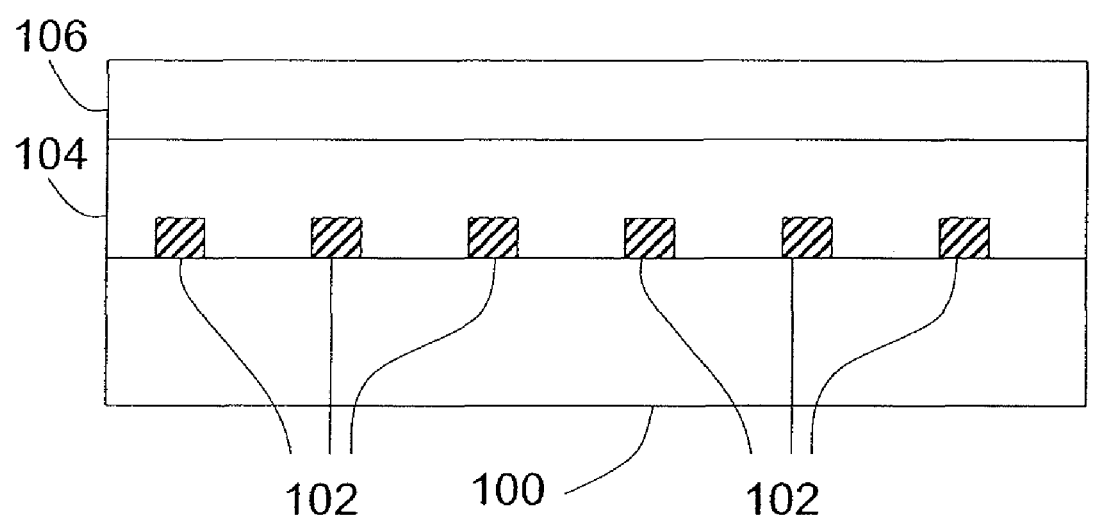
FIG. 2 is a cross-sectional view of a semiconductor wafer showing the growth of epitaxial layers, according to an embodiment of the present invention.

FIG. 2 is a cross-sectional view of a semiconductor wafer showing the growth of epitaxial layers, according to an embodiment of the present invention. After the hard material is applied to the substrate 100 in the form of polishing stops 102, one or more epitaxial layers 104, 106 are grown on the substrate 100. In the illustrated embodiment shown in FIG. 2, a buffer layer 104, such as a u-GaN layer, is grown on the substrate 100. While only one layer epitaxial 106 is shown being grown on the buffer layer 104, this layer is intended to represent any number of layers of any suitable semiconductor materials that can be grown according to the particular application requirements. Similarly, while only one buffer layer 104 is shown, this layer is intended to represent one or more buffer layers, as required. One example configuration for the epitaxial growth, which may be used for the production of GaN LED, includes an undoped, or lightly doped, u-GaN layer grown on the sapphire substrate 100, followed by one or more highly doped n-type GaN (n-GaN) layers, an active layer having a multiple quantum well (MQW) structure, and a p-type GaN (p-GaN) layer. However, the illustrated examples are not intended to limit the present invention to any particular number or ordering of different epitaxial layers.

Generally, it can be difficult to know the thickness of the u-Gan layer, and also difficult to know with certainty the interface, or junction, between u-GaN and the remaining layers, such as the n-type layers. Accordingly, the ability to do this in known fabrication methods has proven difficult, costly, and/or not possible. Therefore, embodiments of the present invention also provide for the removal of the u-GaN layer with certainty, knowing with the required degree of certainty where the sapphire substrate removal should be stopped.

Figure 3:
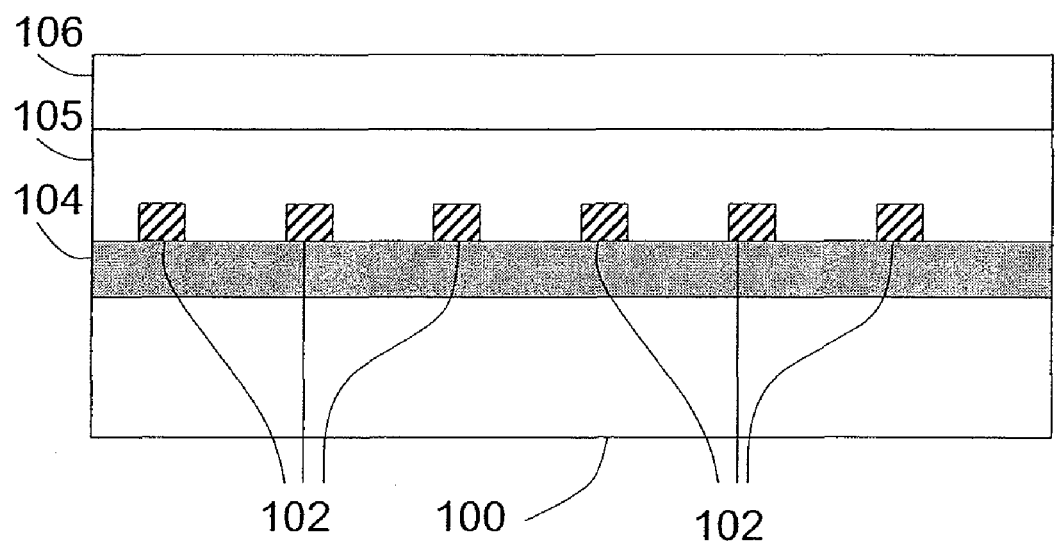
FIG. 3 is a cross-sectional view of a semiconductor wafer showing the formation of polishing stops on an epitaxial layer, according to an embodiment of the present invention.

FIG. 3 is a cross-sectional view of a semiconductor wafer showing the formation of polishing stops on an epitaxial layer, according to an embodiment of the present invention. In the illustrated embodiment shown in FIG. 3, one or more first buffer layers 104 is grown on the substrate 100. Polishing stops 102 are then formed on one of the first buffer layers 104. Another one or more buffer layers 105 may be grown on the polishing stops 102. Then one or more epitaxial layers 106 may be grown on the second buffer layers 105. As similarly described with reference to FIG. 2, while only one layer 106 is shown being grown on the second buffer layer 105, this layer is intended to represent any number of layers of any suitable semiconductor materials that can be grown according to the particular application requirements.

Figure 4:
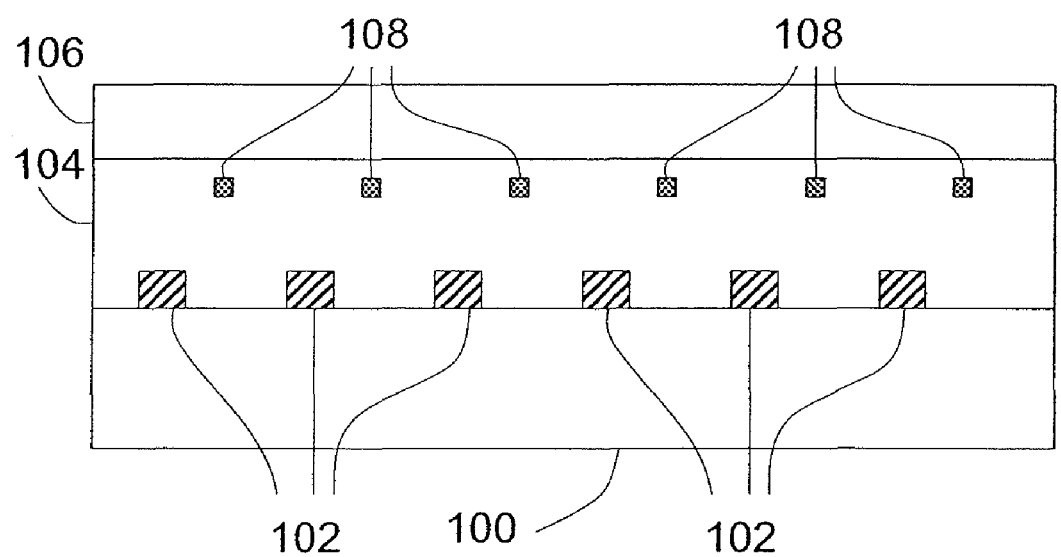
FIG. 4 is a cross-sectional view of a semiconductor wafer showing the formation of photonic structures in an epitaxial layer, according to an embodiment of the present invention.

FIG. 4 is a cross-sectional view of a semiconductor wafer showing the formation of photonic structures in an epitaxial layer, according to an embodiment of the present invention. The example embodiment illustrated in FIG. 4 is similar to FIG. 2, having a substrate 100, polishing stops 102 applied to the substrate 100, one or more buffer layers 104, and one or more epitaxial layers 106 grown on the one or more buffer layers 104. Light altering materials 108 are added to the one or more buffer layers 104. The light altering materials 108 may be light scattering elements for enhanced light extraction, in the case of LED fabrication. For example, photonic crystal structures may be added by etching or by the addition of materials to the layer, such as silicon dioxide ($SiO_2$) or silicon nitride (SiN). The photonic structures may also be a vacuum or include the absence of materials at predetermined locations within the material layers.

Figure 5:
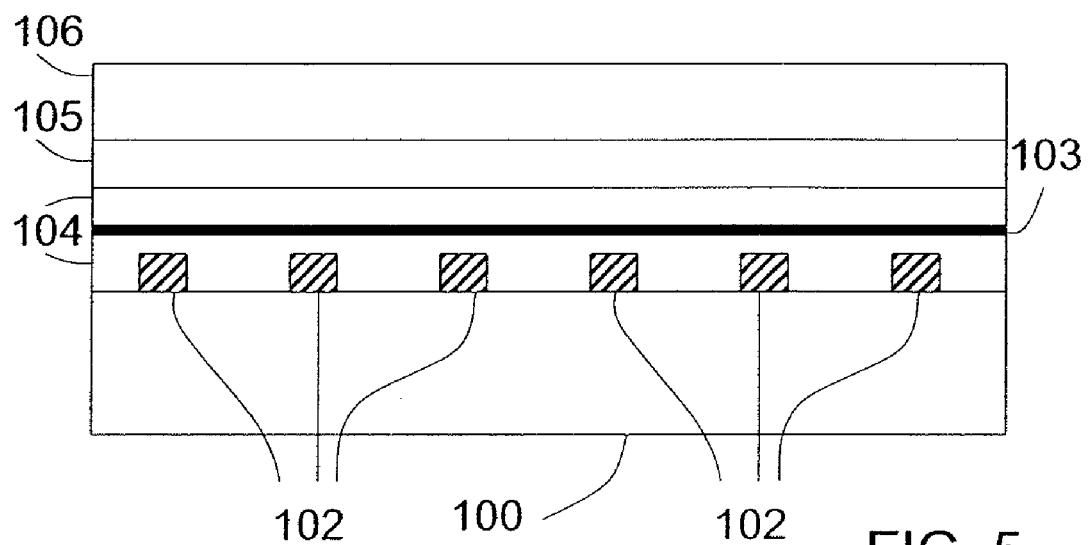
FIG. 5 is a cross-sectional view of a semiconductor wafer showing the formation of polishing stops combined with an etching stop layer, according to an embodiment of the present invention.

FIG. 5 is a cross-sectional view of a semiconductor wafer showing the formation of polishing stops combined with an etching stop layer, according to an embodiment of the present invention. The example embodiment illustrated in FIG. 5 is similar to FIG. 2, having a substrate 100, polishing stops 102 applied to the substrate 100, one or more buffer layers 104, 105, and one or more epitaxial layers 106 grown on the one or more buffer layers 104, 105. Additionally, an etching stop layer 103 is grown in or between the one or more buffer layers 104. The etching stop layer 103 may be advantageous during later etching processes. In one embodiment, highly selective wet etching will be used, however dry etching and other suitable etching methods as known by those of skill in the field may also be used. One or more stop layers may be used for subsequent processes after the removal of the substrate 100. For example, etching processes may be terminated at the stop layer 103. The stop layer may also serve as a leakage reduction layer, such as in the later use of the wafer for manufacturing transistors and the like.

According to one embodiment, the stop layer 103 is an AlInGaN layer that has the property of $Al_xIn_yGa_{(1-x-y)}N$. In one embodiment, x is less than or equal to approximately 0.35. In another embodiment, x is less than or equal to approximately 0.4. In another embodiment, x may be in a range of 0.2 to 0.5. In one embodiment, y is less than or equal to approximately 0.1. In another embodiment, y is less than or equal to approximately 0.2 or within a range of 0.05 to 0.25. However, other suitable values and other ranges for the values of x and y may be used. According to another embodiment, the stop layer 103 may be a highly doped AlGaN layer having the property $Al_xGa_{(1-x)}N$ layer. One possible thickness of the AlGaN layer may be less than 0.2 μm. In another embodiment, thickness of the AlGaN layer may equal to approximately 0.2 μm. In one embodiment, the layer thickness should be thin enough for n-doping into the AlN layer. If a thicker $Al_xGa_{(1-x)}N$ layer is used as the stop layer, then the Al mole fraction should be less than approximately 0.35 in order to make for more easier doping of Si into the AlGaN layer.

The stop layer provides for high etching selectivity. One method of high etching selectivity uses photo-electrochemical (PEC) wet etching, which is a high bandgap-dependent etching selectivity. PEC etching is the photo-generation of electron hole pairs, which enhances the oxidation and reduction reaction in an electrochemical reaction. The stop layer 103 may also comprise a AlN/GaN super lattice structure, according to an embodiment of the present invention. The super lattice stop layer comprises a GaN layer and an AlN layer, which together form an AlN/GaN super lattice (~30 Å/30 Å) stop layer. The super lattice structure is formed by adjacent layers of AlN and GaN. The super lattice structure may comprise any desired number of pairs of AlN and GaN.

Figure 6:
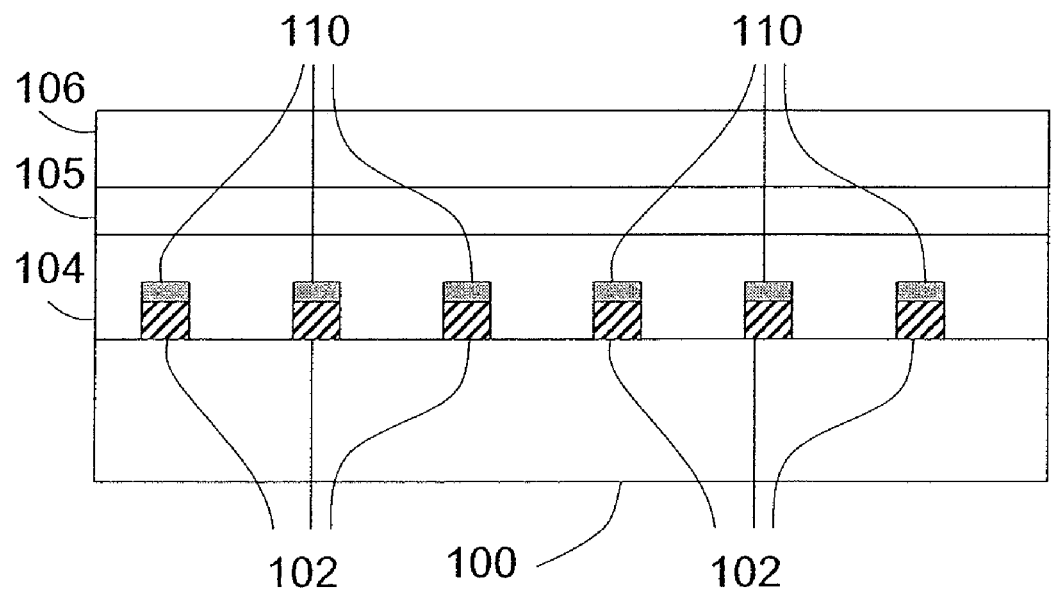
FIG. 6 is a cross-sectional view of a semiconductor wafer showing the formation of polishing stop layers, according to an embodiment of the present invention

FIG. 6 is a cross-sectional view of a semiconductor wafer showing the formation of polishing stop layers, according to an embodiment of the present invention. The example embodiment illustrated in FIG. 6 is similar to FIG. 2, having a substrate 100, polishing stops 102 applied to the substrate 100, one or more buffer layers 104, 105, and one or more epitaxial layers 106 grown on the one or more buffer layers 104, 105. Additionally, a polishing stop layer 110 is added to each of the polishing stops 102. The polishing stop layer 110 may reduce stress or lattice mismatch between the polishing stop 102 and the buffer layer 104. The polishing stop layer 110 may also be used for dislocation reduction by epitaxial lateral overgrowth.

According to one embodiment, each of the polishing stops 102 is made from first material, and each of the polishing stop layers is made from a second material, the advantage being provided by the difference between the two materials. According to another embodiment, the polishing stop layer may fully surround and cover the polishing stop, such that no part of the polishing stop contacts the surrounding layer that is adjacent to the polishing stops 102.

Referring now to FIGS. 7 to 13, the semiconductor wafer described with reference to FIGS. 1 to 6 may be further used in the making of semiconductor devices.

Figure 7:
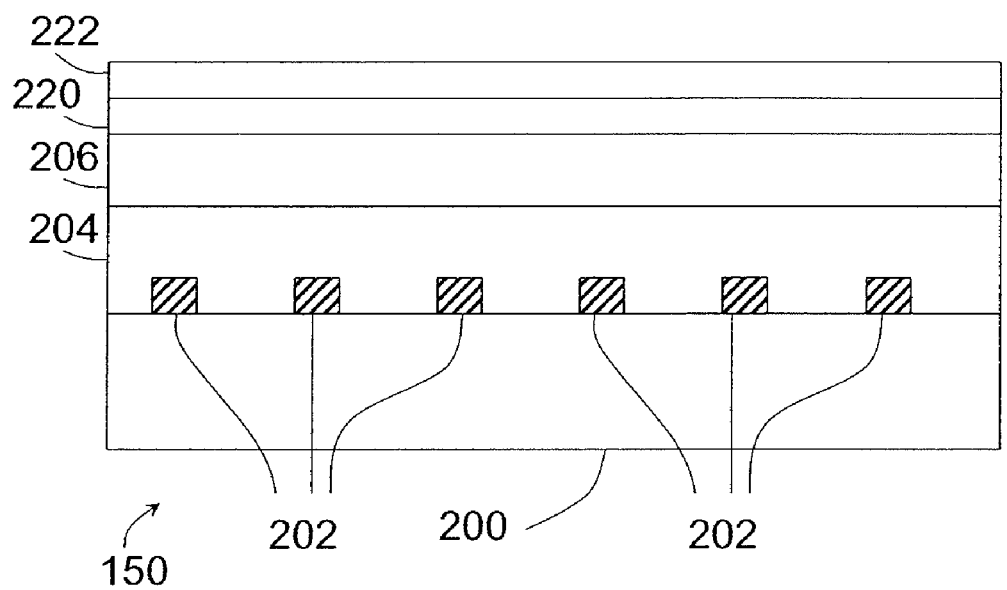
FIG. 7 is a cross-sectional view of a semiconductor device showing the formation of polishing stops, according to an embodiment of the present invention.

FIG. 7 is a cross-sectional view of a semiconductor device 150 showing the formation of polishing stops, according to an embodiment of the present invention. The example embodiment illustrated in FIG. 7 includes the components shown in FIG. 2 in addition to other layers. The semiconductor device 150 includes a substrate 200, polishing stops 202 applied to the substrate 200, one or more buffer layers 204 grown on the substrate 200, and one or more epitaxial layers 206 grown on the one or more buffer layers 204. Additionally, during the fabrication of semiconductor devices, additional layers maybe added to the one or more epitaxial layers 206 using a build-up or lamination process or any other suitable fabrication processes. In the illustrated embodiment, the semiconductor device 150 includes one or more metal layers 220, 222. The one or more metal layers 220, 222 may be any such materials as required by the particular application, such as Ohmic contact, mirror, plating seed layer, bonding materials, buffer layers for stress, or other metal layers.

Figure 8:
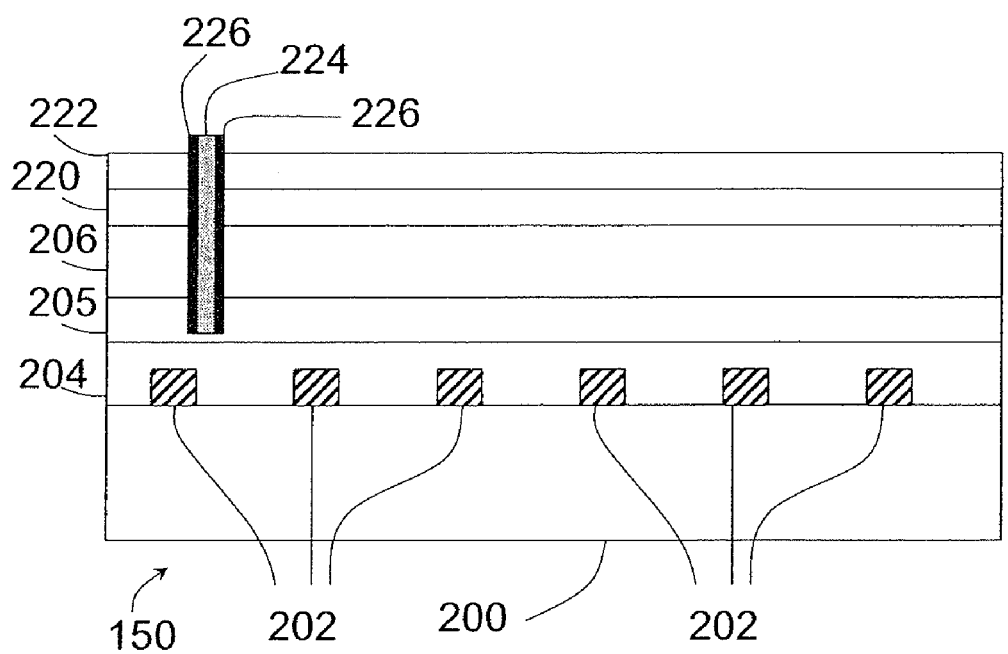
FIG. 8 is a cross-sectional view of a semiconductor device showing the formation of a built-in contact, according to an embodiment of the present invention.

FIG. 8 is a cross-sectional view of a semiconductor device showing the formation of a built-in contact, according to an embodiment of the present invention. The example embodiment illustrated in FIG. 8 is similar to that shown in FIG. 7, the semiconductor device 150 having a substrate 200, polishing stops 202 applied to the substrate 100, one or more buffer layers 204 grown on the substrate, one or more conductive layers 205 grown on the one or more buffer layers 204, one or more epitaxial layers 206 grown on the one or more conductive layers 205, and one or more metal layers 220, 222 added to the one or more epitaxial layers 206. The semiconductor device 150 further includes a built-in n-type contact 224 that extends into the one or more conductive layers 205. The n-type contact 224 may be surrounded by insulating material 226 to prevent or reduce contact with other semiconductor device layers.

Figure 9:
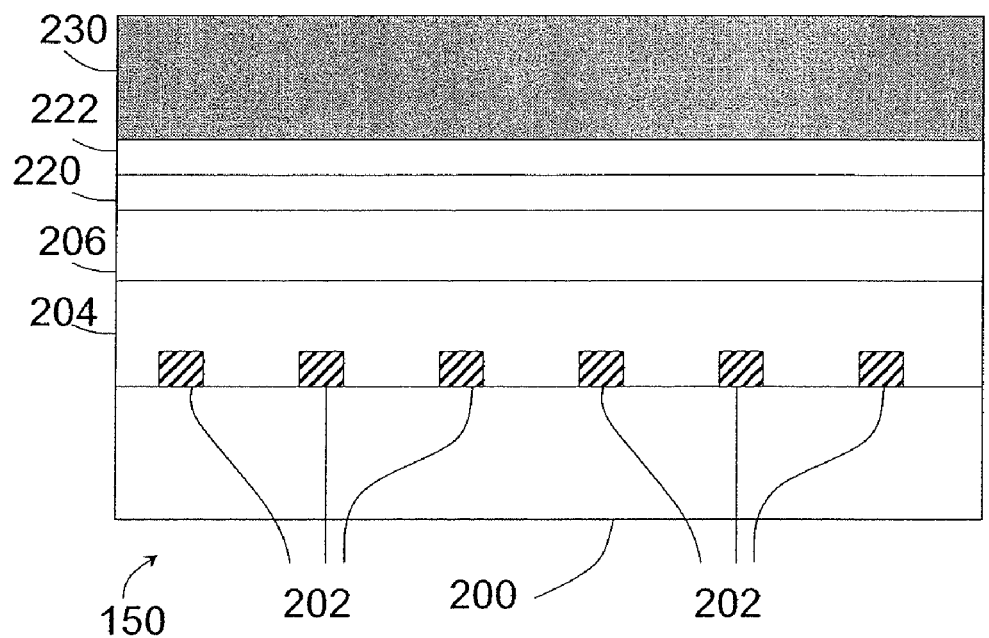
FIG. 9 is a cross-sectional view of a semiconductor device showing the formation of a new substrate, according to an embodiment of the present invention.

FIG. 9 is a cross-sectional view of a semiconductor device showing the formation of a new substrate, according to an embodiment of the present invention. The example embodiment illustrated in FIG. 9 is similar to that shown in FIG. 7, the semiconductor device 150 having a substrate 200, polishing stops 202 applied to the substrate 200, one or more buffer layers 204 grown on the substrate 200, one or more epitaxial layers 206 grown on the one or more buffer layers 204, and one or more metal layers 220, 222 added to the one or more epitaxial layers 206. The semiconductor device 150 further includes a second substrate 230 bonded or plated to the one or more metal layers 220, 222. For example, the second substrate may be formed from any suitable material, such as, for example, copper or other materials suitable as a semiconductor device substrate.

Figure 10:
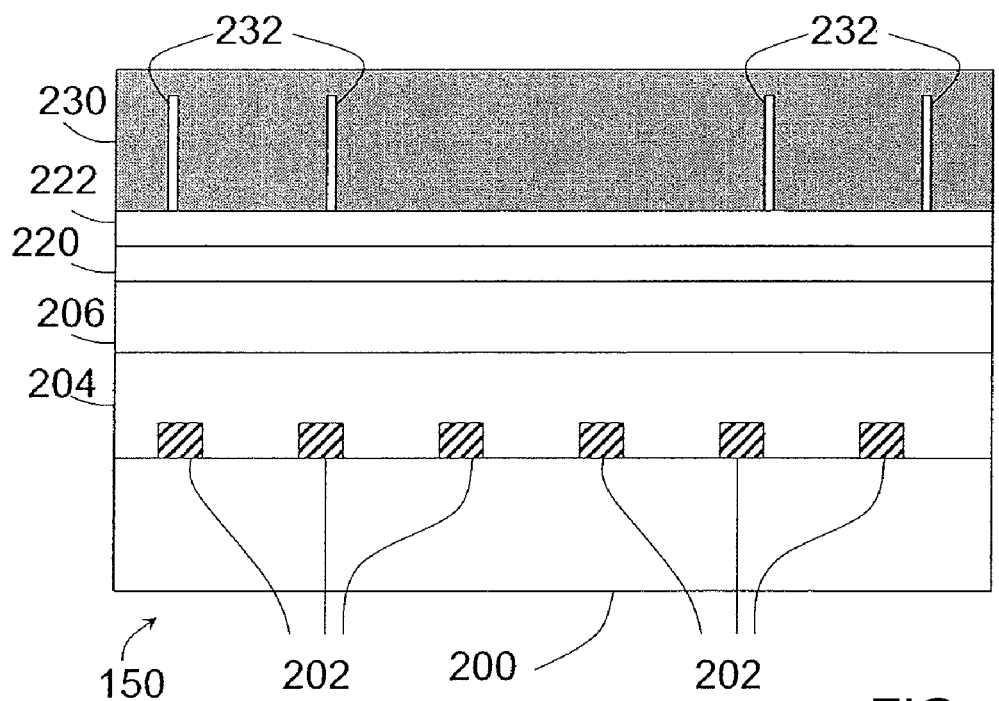
FIG. 10 is a cross-sectional view of a semiconductor device showing patterned plating, according to an embodiment of the present invention.

FIG. 10 is a cross-sectional view of a semiconductor device showing patterned plating, according to an embodiment of the present invention. The example embodiment illustrated in FIG. 10 is similar to that shown in FIG. 9, the semiconductor device 150 having a substrate 200, polishing stops 202 applied to the substrate 200, one or more buffer layers 204 grown on the substrate 200, one or more epitaxial layers 206 grown on the one or more buffer layers 204, one or more metal layers 220, 222 added to the one or more epitaxial layers 206, and a second substrate 230 bonded or plated to the one or more metal layers 220, 222. In the illustrated embodiment, patterned plating 232 of the second substrate 230 may facilitate dicing and stress release when separating the semiconductor device 150 into individual, separate components. In one embodiment, the patterned plating 232 is formed using a photoresist process.

Figure 11:
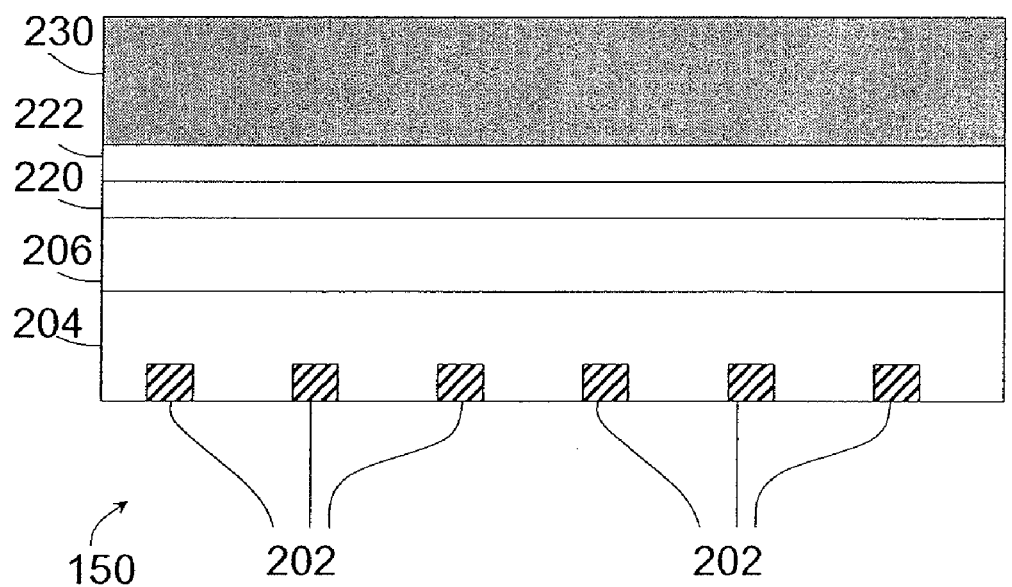
FIG. 11 is a cross-sectional view of a semiconductor device showing substrate removal, according to an embodiment of the present invention.

FIG. 11 is a cross-sectional view of a semiconductor device showing substrate removal, according to an embodiment of the present invention. The example embodiment illustrated in FIG. 11 is similar to that shown in FIG. 9, the semiconductor device 150 having polishing stops 202 formed in the one or more buffer layers 204 that were applied to the substrate 200 (FIGS. 9 and 10), one or more epitaxial layers 206 grown on the one or more buffer layers 204, one or more metal layers 220, 222 added to the one or more epitaxial layers 206, and the second substrate 230 bonded or plated to the one or more metal layers 220, 222. In the illustrated embodiment of FIG. 11, when compared to FIGS. 9 and 10, the substrate 200 has been removed. In one embodiment, the substrate 200 is removed by a mechanical thinning process, which generally may include grinding, lapping, polishing or chemical mechanical polishing of the surface as part of the process. Other removal methods may be used. However, using a mechanical thinning method in combination with embodiments of the present invention provides added advantages of speed and accuracy. As illustrated in FIG. 11, the removal by the mechanical thinning process stops at the ends of the polishing stops 202. As the polishing stops 202 are formed from a hard material, mechanical thinning can be stopped with certainty and precision at the location of the polishing stops, leaving the remaining layers. Also, through the use of polishing stops 202 the flatness of the remaining surface can be controlled within required limits.

Figure 12:
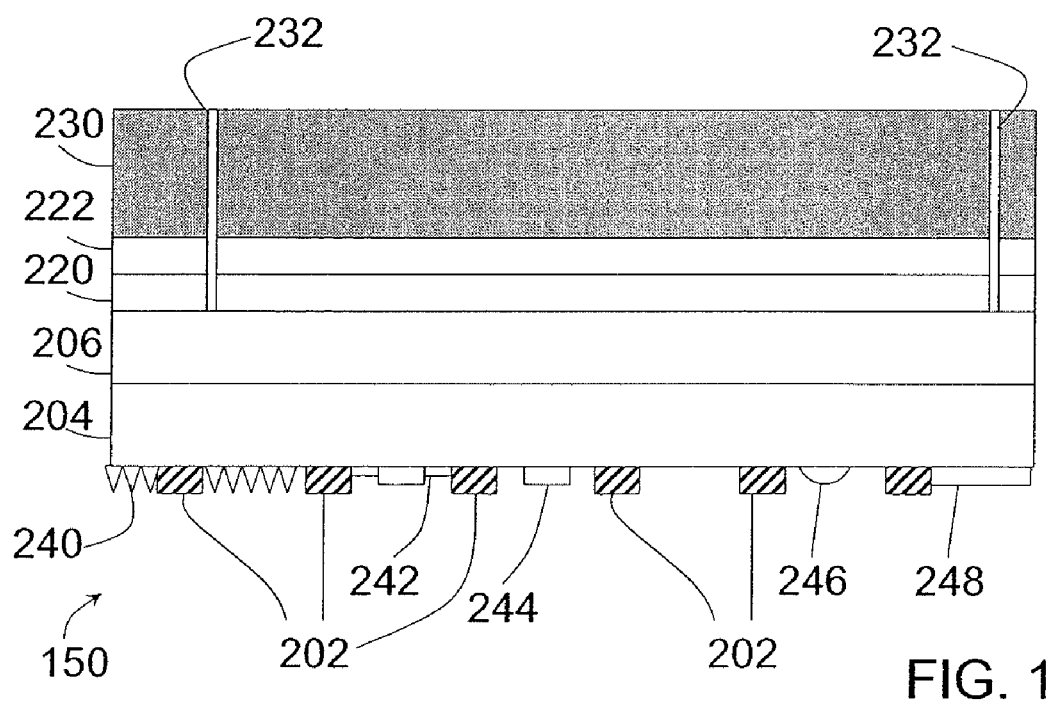
FIG. 12 is a cross-sectional view of a semiconductor device showing example semiconductor device surface variations, according to an embodiment of the present invention.

FIG. 12 is a cross-sectional view of a semiconductor device showing example semiconductor device surface variations, according to an embodiment of the present invention. The example embodiment illustrated in FIG. 12 is similar to that shown in FIG. 11, the semiconductor device 150 having polishing stops 202 formed in the one or more buffer layers 204 that were applied the substrate 200 (FIGS. 9 and 10), one or more epitaxial layers 206 grown on the one or more buffer layers 204, one or more metal layers 220, 222 added to the one or more epitaxial layers 206, and the second substrate 230 bonded or plated to the one or more metal layers 220, 222. At least a portion of the buffer layer 204 has been removed during an etching process, thereby exposing at least part of the polishing stops 202. A plurality of different LED features have been shown on the semiconductor device 150 for illustration purposes. For example, shown in FIG. 12 are surface texturing 240, passivation 242, and Ohmic contact or bonding pad 244, a microlens 246, and a transparent contact layer 248. Additionally, patterned plating 232 is formed in the second substrate 230 and the one or more metal layers 220, 222 to facilitate dicing and stress release when separating the semiconductor device 150 into individual, separate components.

Figure 13:
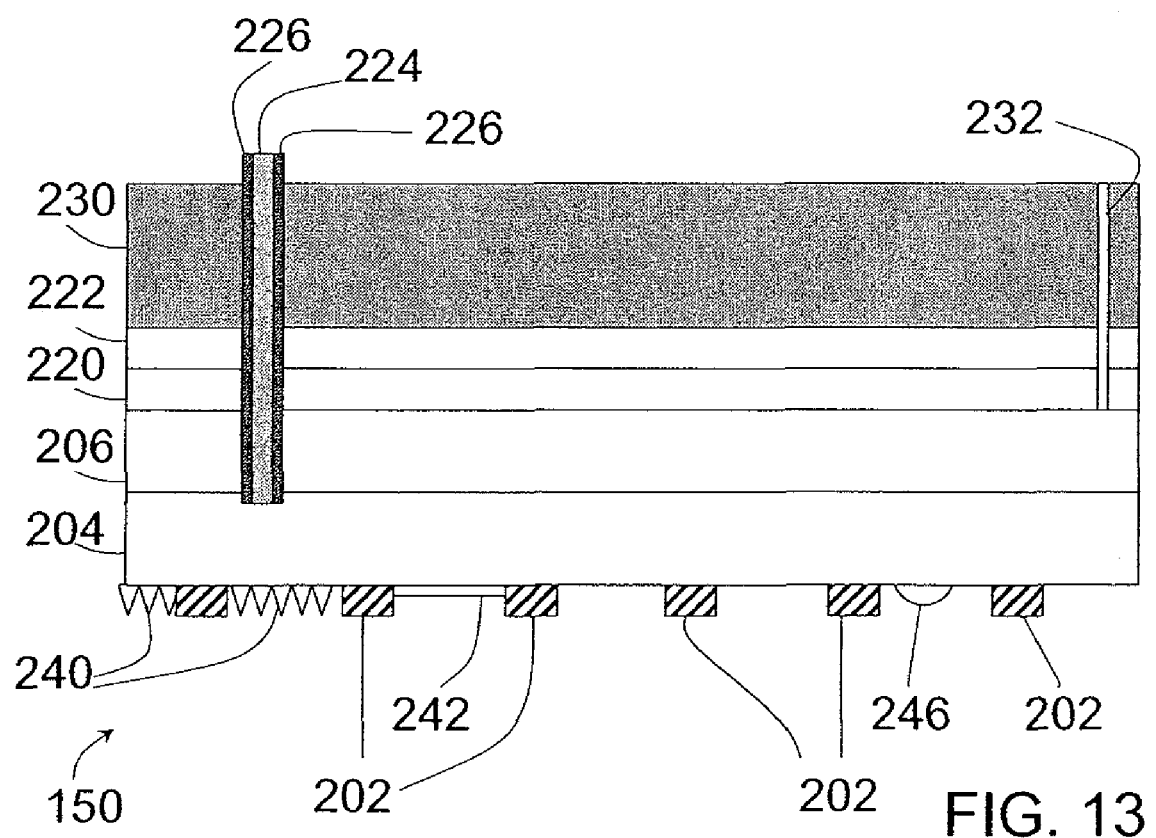
FIG. 13 is a cross-sectional view of a semiconductor device showing the formation of a built-in contact, according to an embodiment of the present invention.

FIG. 13 is a cross-sectional view of a semiconductor device showing the formation of a built-in contact, according to an embodiment of the present invention. The example embodiment illustrated in FIG. 13 is similar to that shown in FIG. 12, further including a built-in n-type contact 224 that extends into the one or more conductive layers 205. The n-type contact 224 may be surrounded by insulating material 226 to prevent or reduce contact with other semiconductor layers.

In a conventional semiconductor wafer, when applying a mechanical thinning method, if the plane to be polished is very large, the variation in the thickness of the layer can be too large for useful, practical application. The inclusion of polishing stops, in accordance with embodiments of the present invention, serves to effectively reduce the size of the plane so that the variation in the thickness is reduced, even though the overall size of the plane is larger. Therefore, an acceptable range of variation can be obtained by controlling the size of and/or the distance between the polishing stops While the polishing stops are shown generally as square or rectangular, the polishing stops according to embodiments of the present invention can be any shape, such as lines, dots, circles, triangles, or rectangles, and may be located in any suitable positions on the plane.

While the invention has been particularly shown and described with reference to the illustrated embodiments, those skilled in the art will understand that changes in form and detail may be made without departing from the spirit and scope of the invention. For example, while the semiconductor devices illustrated in FIGS. 7 to 13 incorporate the polishing stops 202 applied to the sapphire substrate 200, other embodiments of the semiconductor devices can incorporate the polishing stops 202 applied to an epitaxial layer of the semiconductor device, as described above with reference to FIG. 3. Accordingly, the above description is intended to provide example embodiments of the present invention, and the scope of the present invention is not to be limited by the specific examples provided.

What is claimed is:

1. A semiconductor wafer comprising:
   a substrate;
   a plurality of polishing stops on one side of the wafer;
   one or more buffer layers grown on the plurality of polishing stops;
   a plurality of light scattering elements, above the plurality of polishing stops, in the one or more buffer layers;
   one or more epitaxial layers on the one or more buffer layers; and
   a second substrate combined with the epitaxial layer.

2. The semiconductor wafer of claim 1, wherein each of the polishing stops includes a polishing stop layer applied to the polishing stop, and wherein each of the plurality of polishing stops is made from a first material and each of the plurality of polishing stop layers is made from a second material.

3. The semiconductor wafer of claim 2, wherein each of the polishing stop layers fully covers the polishing stop.

4. The semiconductor wafer of claim 1, wherein the polishing stop comprises:
   diamond, diamond like carbon, titanium nitride, or titanium tungsten.

5. A semiconductor device comprising:
   a plurality of polishing stops on one side of the wafer;
   one or more buffer layers grown on the plurality of polishing stops;
   a plurality of light scattering elements, above the plurality of polishing stops, in the one or more buffer layers;
   one or more epitaxial layers on the one or more buffer layers;
   one or more metal layers on the one or more epitaxial layers; and
   a substrate combined with the epitaxial layer.

6. The semiconductor device of claim 5, wherein the one or more metal layers are added to the one or more epitaxial layers using a build-up or lamination process.

7. The semiconductor device of claim 5, further comprising a highly doped stop layer formed between one or more of the buffer layers.

8. The semiconductor device of claim 7, wherein the highly doped stop layer is one or more layers of AlInGaN.

9. The semiconductor device of claim 5, wherein the substrate is a copper substrate.

10. The semiconductor wafer of claim 5, wherein each of the polishing stops includes a polishing stop layer applied to the polishing stop, and wherein each of the plurality of polishing stops is made from a first material and each of the plurality of polishing stop layers is made from a second material.

11. The semiconductor wafer of claim 5, wherein the polishing stop comprises:
   diamond, diamond like carbon, titanium nitride, or titanium tungsten.

12. A method of making a semiconductor wafer, the method comprising:
   providing a substrate;
   forming a plurality of polishing stops on the substrate;
   growing one or more buffer layers on the substrate;
   forming a plurality of light scattering elements, above the plurality of polishing stops, in the one or more buffer layers;
   growing one or more epitaxial layers on the one or more buffer layers;
   bonding or plating a second substrate to one or more epitaxial layers; and
   removing the substrate until reaching the polishing stops.

13. The method of claim 12, further comprising forming a polishing stop layer on each of the plurality of polishing stops, and wherein each of the plurality of polishing stops is made from a first material and each of the plurality of polishing stop layers is made from a second material.

14. The method of making a semiconductor device of claim 12, further comprising adding one or more metal layers to the one or more epitaxial layers.

15. The method of making a semiconductor wafer of claim 14, wherein the one or more metal layers are applied by patterned plating to facilitate the dicing of the semiconductor wafer.

16. The method of making a semiconductor wafer of claim 14, wherein the one or more metal layers includes a contact layer, the method further comprising forming a built-in contact from a surface of the semiconductor wafer to the contact layer, and wherein the built-in contact is surrounded by insulating material reduce contact with the remaining epitaxial layer and the one or more metal layers.

17. The method of making a semiconductor wafer of claim 14, further comprising:
   affixing a second substrate to the one or more metal layers; and
   removing the substrate using a mechanical thinning process.

18. A method of making a semiconductor wafer, the method comprising:
   providing a substrate;
   growing a first one or more buffer layers on the substrate;
   forming a one or more polishing stops on first one or more buffer layers;
   forming a plurality of light scattering elements, above the one or more polishing stops;
   growing one or more epitaxial layers on the first one or more buffer layers;
   bonding or plating a second substrate to one or more epitaxial layers; and
   removing the substrate until reaching the polishing stops.

19. A semiconductor wafer comprising:
   one or more buffer layers;
   a plurality of polishing stops formed in the one or more buffer layers;
   a plurality of light altering scattering elements, above the plurality of polishing stops;
   one or more epitaxial layers on the one or more buffer layers; and
   a substrate combined with the epitaxial layer.

20. The semiconductor wafer of claim 19, wherein each of the polishing stops includes a polishing stop layer applied to the polishing stop, and wherein each of the plurality of polishing stops is made from a first material and each of the plurality of polishing stop layers is made from a second material.

21. The semiconductor wafer of claim 19, further comprising an etching stop layer.

22. The semiconductor wafer of claim 19, further comprising one or more metal layers.

23. The semiconductor wafer of claim 19, wherein the polishing stop comprises:
   diamond, diamond like carbon, titanium nitride, or titanium tungsten.

* * * * *